(12) United States Patent
Choi et al.

(10) Patent No.: US 11,710,720 B2
(45) Date of Patent: Jul. 25, 2023

(54) INTEGRATED MULTI-DIE PARTITIONED VOLTAGE REGULATOR

(71) Applicant: Intel Corporation, Santa Clara, CA (US)

(72) Inventors: Beomseok Choi, Chandler, AZ (US); Siddharth Kulasekaran, Tempe, AZ (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1167 days.

(21) Appl. No.: 16/022,515

(22) Filed: Jun. 28, 2018

(65) Prior Publication Data

US 2020/0006292 A1 Jan. 2, 2020

(51) Int. Cl.
| | | |
|---|---|---|
| *H01L 25/065* | (2023.01) | |
| *H01L 25/18* | (2023.01) | |
| *H02M 1/08* | (2006.01) | |
| *H02M 3/158* | (2006.01) | |
| *H02M 1/00* | (2006.01) | |

(52) U.S. Cl.
CPC ...... *H01L 25/0657* (2013.01); *H01L 25/0652* (2013.01); *H01L 25/18* (2013.01); *H02M 1/08* (2013.01); *H01L 2225/06513* (2013.01); *H01L 2225/06517* (2013.01); *H01L 2225/06541* (2013.01); *H01L 2225/06548* (2013.01);
(Continued)

(58) Field of Classification Search
CPC . H01L 25/0657; H01L 25/0652; H01L 25/18; H01L 2225/06513; H01L 2225/06517; H01L 2225/06541; H01L 2225/06548; H01L 2225/06572; H02M 3/158
USPC .......................................................... 327/540
See application file for complete search history.

(56) References Cited

U.S. PATENT DOCUMENTS 6,278,264 B1 * 8/2001 Burstein ........... H01L 23/49844
257/700
7,646,108 B2 * 1/2010 Paillet ................... H02M 3/158
323/267
(Continued)

FOREIGN PATENT DOCUMENTS

WO 2017052552 3/2017

OTHER PUBLICATIONS

Office Action for U.S. Appl. No. 16/022,511, dated Mar. 28, 2022.
(Continued)

*Primary Examiner* — Viet Q Nguyen
(74) *Attorney, Agent, or Firm* — Essential Patents Group, LLP

(57) ABSTRACT

A semiconductor package is provided, which includes a first die and a second die. The first die includes a first section of a power converter, and the second die includes a second section of the power converter. The power converter may include a plurality of switches, and a Power Management (PM) circuitry to control operation of the power converter by controlling switching of the plurality of switches. The PM circuitry may include a first part and a second part. The first section of the power converter in the first die may include the first part of the PM circuitry, and the second section of the power converter in the second die may include the second part of the PM circuitry.

20 Claims, 11 Drawing Sheets

(52) U.S. Cl.
CPC . *H01L 2225/06572* (2013.01); *H02M 1/0009* (2021.05); *H02M 3/158* (2013.01)

(56) References Cited

U.S. PATENT DOCUMENTS

| | | | | |
|---|---|---|---|---|
| 7,825,502 | B2* | 11/2010 | Irving | H01L 23/49548 |
| | | | | 257/772 |
| 8,063,618 | B2* | 11/2011 | Lam | H02M 3/155 |
| | | | | 323/283 |
| 8,582,333 | B2* | 11/2013 | Oraw | H02M 3/07 |
| | | | | 361/767 |
| 9,391,453 | B2* | 7/2016 | Droege | G11C 5/025 |
| 9,921,640 | B2* | 3/2018 | Zillmann | H01L 23/5227 |
| 10,224,310 | B2* | 3/2019 | Liu | H01L 25/0657 |
| 10,236,209 | B2* | 3/2019 | Sharan | H01L 23/5223 |
| 10,348,191 | B2* | 7/2019 | Giuliano | H01L 24/20 |
| 10,367,415 | B1 | 7/2019 | Sturcken | H01F 27/24 |
| 10,504,848 | B1* | 12/2019 | Parto | H01L 23/5383 |
| 10,658,331 | B2* | 5/2020 | Sturcken | H01L 25/04 |
| 10,826,492 | B2* | 11/2020 | Dubey | H01L 25/0657 |
| 10,873,262 | B2* | 12/2020 | Zeng | H02M 1/08 |
| 10,879,025 | B2* | 12/2020 | Mori | B81C 1/00246 |
| 10,924,011 | B2* | 2/2021 | Parto | H02M 3/33561 |
| 11,133,256 | B2* | 9/2021 | Jain | H01L 28/20 |
| 11,183,934 | B2* | 11/2021 | Clavette | H01L 27/0676 |
| 11,227,838 | B2* | 1/2022 | Lin | H01L 23/5386 |
| 11,320,883 | B2* | 5/2022 | Baskaran | G06F 1/3275 |
| 11,450,628 | B2* | 9/2022 | Tang | H01L 23/5227 |
| 2015/0003181 | A1 | 1/2015 | Droege et al. | |
| 2015/0229295 | A1* | 8/2015 | Andry | G06F 1/263 |
| | | | | 327/109 |
| 2016/0372449 | A1* | 12/2016 | Rusu | H01L 23/64 |
| 2019/0295952 | A1 | 9/2019 | Sikka et al. | |
| 2020/0251448 | A1* | 8/2020 | Choi | H01L 25/18 |

OTHER PUBLICATIONS

Restriction Requirement for U.S. Appl. No. 16/022,511, dated Nov. 17, 2021.
Final Office Action for U.S. Appl. No. 16/022,511, dated Aug. 26, 2022.

* cited by examiner

INTEGRATED MULTI-DIE PARTITIONED VOLTAGE REGULATOR

BACKGROUND

A voltage regulator (VR), such as a Direct Current (DC) to DC converter, may include switches, drivers, feedback mechanism (e.g., which feeds back an output voltage of the VR to a controller), the controller, sense circuitries (e.g., which sense voltage and/or current of individual switches, to be used for, for example, power management, controlling of the VR, soft switching, etc.), and/or the like. It may be useful to efficiently position various components of the VR in a semiconductor package.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
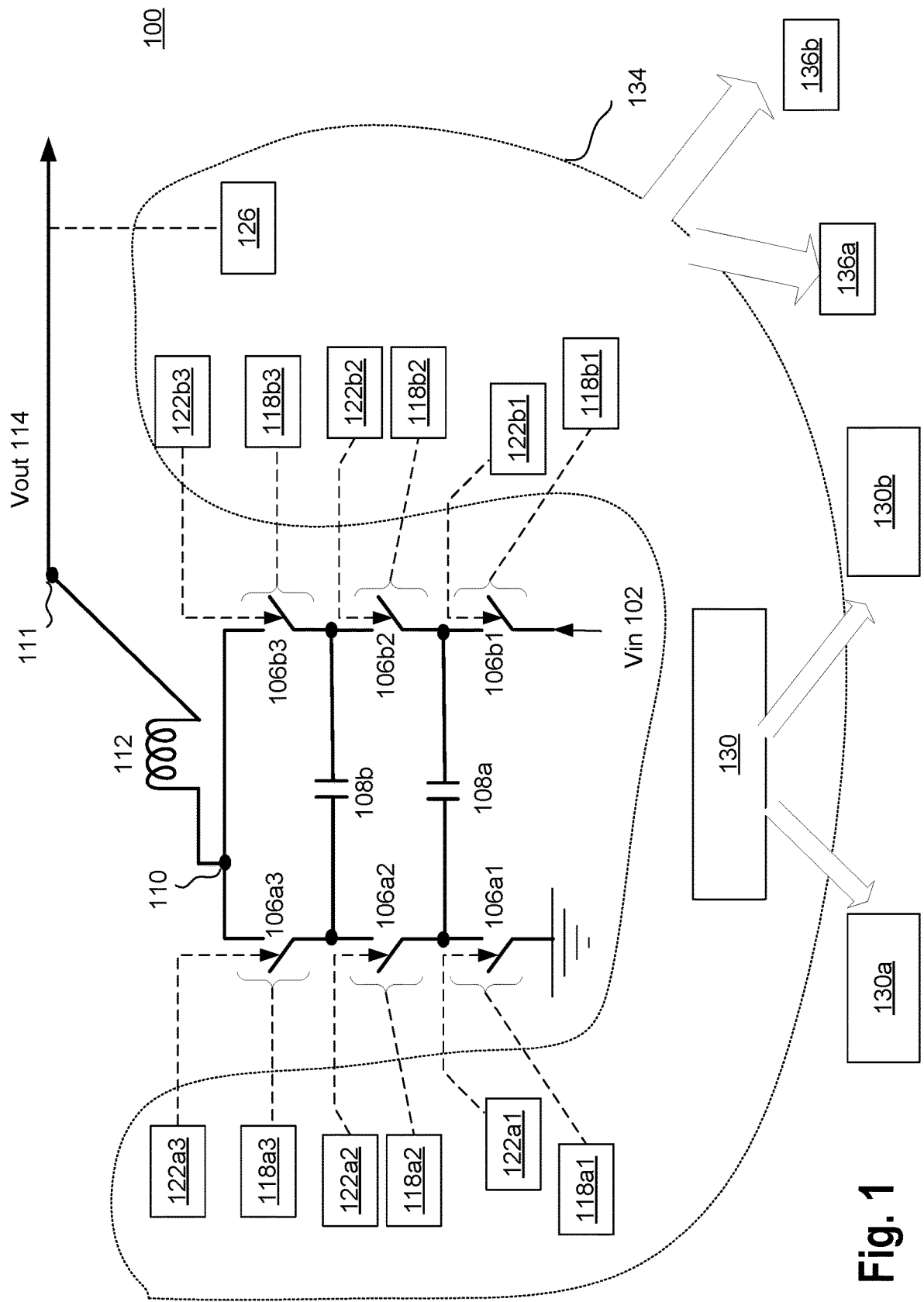
FIG. 1 schematically illustrates a VR, in which a Power Management (PM) circuitry may be partitioned in two or more sections, such that individual ones of the two or more sections may reside in corresponding separate dies, according to some embodiments.

A VR (e.g., a fully integrated VR (FIVR)) may include multiple components, such as switches, sense circuitries, drivers, controllers, feedback circuitries, etc. In some embodiments, the components of a VR are partitioned among multiple dies, e.g., instead of lumping all the components in a single die (e.g., to ensure flexible routing among these components, to reduce routing distances between the components, etc.). At least one of the multiple dies may be an application die that includes one or more application circuitries.

In an example, the partitioning of the VR among multiple dies may be based on relative positions of the components in the VR. For example, a sense circuitry, which is to sense a voltage and/or a current of a switch of the VR, may be located in the same die as the switch. The switches of the VR may be distributed among at least two dies.

In another example, the partitioning of the VR among multiple dies may be based on a technology used to implement individual components. For example, one or more analog components (e.g., power switches, analog sensors, etc.) may be included in a die that is primarily geared towards analog technology. One or more digital components (e.g., logic controllers, analog to digital controllers, etc.) may be included in a die that is primarily geared towards digital or logic technology.

In some embodiments, partitioning a VR across multiple dies enables increased flexibility in routing across two-dimensional (2D) and three-dimensional (3D) package integration. VR components may be placed on different technologies that are more optimized for individual needs of the components. Furthermore, components may be strategically laid out to reduce routing distances, which may reduce routing losses. Various examples and embodiments discussed herein may take full advantage of 3D integration, multi-die, and advanced VR topologies. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 schematically illustrates a voltage regulation (VR) system 100 (also referred to as VR 100), in which a Power Management (PM) circuitry 134 may be partitioned in two or more sections 136*a*, 136*b*, such that individual ones of the sections 136*a*, 136*b* may reside in corresponding separate dies, according to some embodiments.

In some embodiments, the VR 100 includes switches 106*a*1, 106*a*2, 106*a*3, 106*b*1, 106*b*2, 106*b*3, and capacitors 108*a*, 108*b*. Elements referred to herein with a common reference label followed by a particular number or alphabet may be collectively referred to by the reference label alone. For example, switches 106*a*1, 106*a*2, 106*a*3, 106*b*1, 106*b*2, 106*b*3 may be collectively and generally referred to as switches 106 in plural, and switch 106 in singular. In another example, switches 106*a*1, 106*a*2, 106*a*3 may be collectively and generally referred to as switches 106*a* in plural, and switch 106*a* in singular. Also, switches 106*b*1, 106*b*2, 106*b*3 may be collectively and generally referred to as switches 106*b* in plural, and switch 106*b* in singular. Similarly, capacitors 108*a*, 108*b* may be collectively and generally referred to as capacitors 108 in plural, and capacitor 108 in singular.

In an example, the switches 106*a*1, 106*a*2, 106*a*3 are coupled in series between a node 110 and a ground terminal, and the switches 106b1, 106b2, 106b3 are coupled in series between the node 110 and an input terminal that is to receive an input voltage Vin 102. The input voltage Vin 102 may receive power from a power supply that supplies power to a device in which the VR 100 is installed. The switches 106 may be implemented using, for example, any appropriate type of transistors.

A first terminal of the capacitor 108a is coupled between the switches 106a1 and 106a2, and a second terminal of the capacitor 108a is coupled between the switches 106b1 and 106b2. A first terminal of the capacitor 108b is coupled between the switches 106a2 and 106a3, and a second terminal of the capacitor 108b is coupled between the switches 106b2 and 106b3. An inductor 112 is coupled between the node 110 and an output node 111, where voltage output Vout 114 is generated at the output node by the VR 100.

The arrangements of the switches 106, capacitors 108 and/or the inductor 112 in the VR 100 are merely examples, and in some other examples, the switches 106, capacitors 108 and/or the inductor 112 may be arranged in other different configurations to form a VR. The example arrangements of the switches 106, capacitors 108 and/or the inductor 112 in the VR 100 do not limit the teachings of this disclosure, and the teachings of this disclosure may be applied to any other configuration of these elements. The arrangements of the switches 106, capacitors 108 and/or the inductor 112 to form a VR are well known to those skilled in the art. The VR 100 is an example of a power converter that may, for example, convert a DC or Alternating Current (AC) power level to a different DC or AC power level.

In some embodiments, the VR 100 includes the PM circuitry 134, which includes a plurality of underlying circuitries, and a boundary of the PM circuitry 134 is illustrated using dotted lines. Various signal lines being input to, or being output by, the PM circuitry 134 are illustrated using dashed lines for purposes of illustrative clarity, and to better distinguish from the power lines (e.g., which are illustrated using solid lines) of the VR 100.

The PM circuitry 134 includes a controller 130 that controls various aspects of operations of the VR 100. For example, the controller 130 controls the switching of the switches 106 by, for example, controlling driver circuitries 118. The controller 130 is coupled to various other circuitries of the PM circuitry 134, e.g., coupled to the driver circuitries 122, sense circuitry 118, feedback circuitry 126, etc. (these circuitries are discussed herein later)—however, the coupling between the controller 130 and the circuitries 118, 122, 126 are not illustrated in FIG. 1 for purposes of illustrative clarity.

In some embodiments, the PM circuitry 134 includes a feedback circuitry 126 that is to sense the output voltage Vout 114, and to provide the feedback to the controller 130. For example, the controller 130 is to compare the feedback of the Vout 114 from the feedback circuitry 126 with a reference voltage Vref (not illustrated in FIG. 1), and operate the various switches of the VR 100 based on such comparison.

In some embodiments, the PM circuitry 134 includes driver circuitries 122a1, 122a2, 122a3, 122b1, 122b2, 122b3, to respectively drive or control switching of the switches 106a1, 106a2, 106a3, 106b1, 016b2, 106b3. For example, a driver circuitry 122 may receive a control signal from the controller 130 (the control signals from the controller 130 to the driver circuitries 122 are not illustrated in FIG. 1), and may control the corresponding switch 106 based on such a control signal. Merely as an example, a driver circuitry 122 may output a Pulse Width Modulation (PWM) signal to the corresponding switch 106, where a first value (e.g., one of a high value or low value) of the PWM signal may turn on the corresponding switch 106, and a second value (e.g., another of the high value or low value) of the PWM signal may turn off the corresponding switch 106.

In some embodiments, the PM circuitry 134 further includes sense circuitries 118. For example, a sense circuitry 118a1 senses voltage and/or current of a corresponding switch 106a1 (e.g., where the sensing is symbolically illustrated using a parenthesis), a sense circuitry 118a2 senses voltage and/or current of a corresponding switch 106a2, a sense circuitry 118a3 senses voltage and/or current of a corresponding switch 106a3, a sense circuitry 118b1 senses voltage and/or current of a corresponding switch 106b1, a sense circuitry 118b2 senses voltage and/or current of a corresponding switch 106b2, and a sense circuitry 118b3 senses voltage and/or current of a corresponding switch 106b3. A sense circuitry 118 may transmit the sensed voltage and/or current of the corresponding switch to the controller 130 (although transmission of the sensed voltages and/or currents from the sense circuitries 118 to the controller 130 are not illustrated in FIG. 1 for purposes of illustrative clarity). The sensing of voltage and/or current of a switch 106 by a corresponding sense circuitry 118 may be performed using any appropriate manner.

In some embodiments, the controller 130 controls the switches 106 based at least in part on the sensed signals. For example, the sensed voltage and/or current output by the sense circuitries 118 may be used for power management, VR control, soft switching, etc. For example, the VR 100 may employ soft-switching, e.g., using the sensed voltage and/or current by the sense circuitries 118, to control switching of the switches 106 of the VR 100. Examples of soft switching, employing the sense circuitries 118, may be zero-voltage switching (ZVS), zero-current switching (ZCS), etc. ZVS or ZCS may enable the VR 100 to engage in soft switching, avoiding possible switching losses that are typically incurred during PWM operation of the drivers 122.

For example, during ZVS soft switching, the voltage of a switch falls to substantially zero (e.g., rather than going below a non-zero threshold voltage) before a switch 106 is turned on or off, thereby eliminating or reducing any overlap between voltage and current and thereby reducing losses. ZCS soft switching may be used to switch the switch 106 when the current, rather than voltage, of the switch 106 reaches substantially zero (e.g., rather than going below a non-zero threshold current).

Although the VR 100 is illustrated to include the sense circuitries 118 (e.g., to employ soft switching), in an example, the VR 100 may not include the sense circuitries 118 (e.g., in such an example, the VR 100 may not employ soft switching). In such an example, the PM circuitry 134 may include at least the driver circuitries 122, the feedback circuitry 126, and the controller 130, but not the sense circuitries 122.

Figure 2:
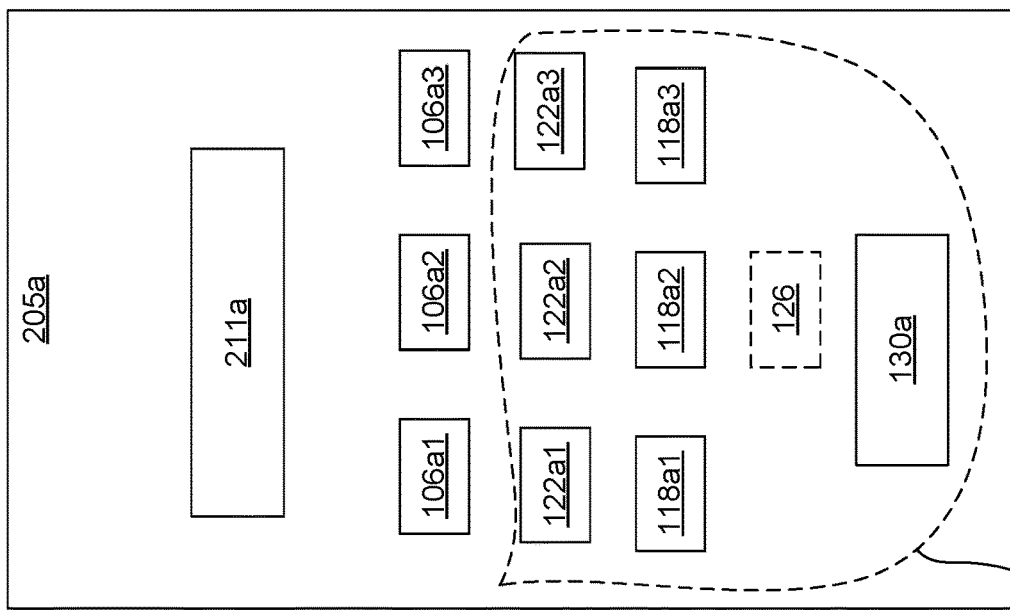
FIG. 2 illustrates a semiconductor package including a first die, a second die, and a substrate, where a VR is partitioned among the first die, the second die, and the substrate, according to some embodiments.
Figure 2:
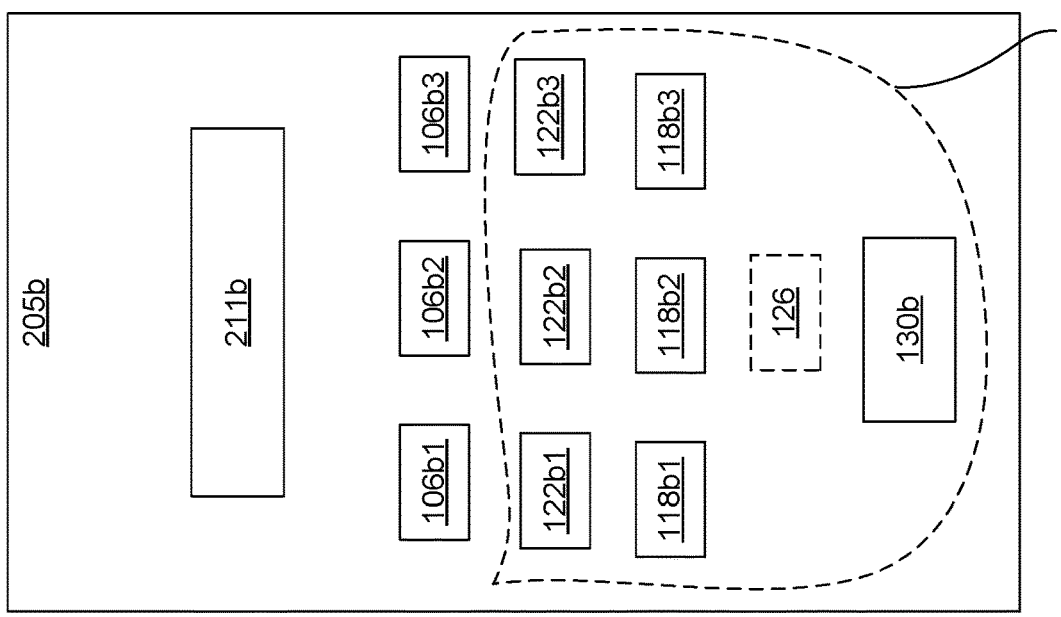
Figure 2:
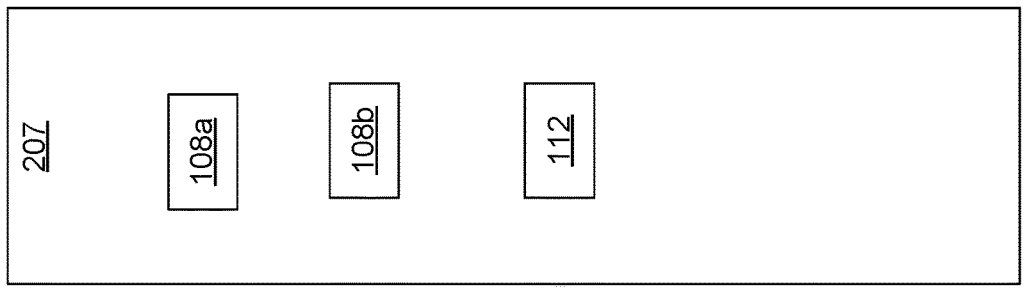

FIG. 2 illustrates a semiconductor package 200 including a first die 205a, a second die 205b, and a substrate 207 (where the dies 205 and the substrate 207 are merely symbolically illustrated in FIG. 2), where the VR 100 of FIG. 1 is partitioned among the first die 205a, the second die 205b, and the substrate 207, according to some embodiments. The relative positions of the dies 205a, 205b, and the substrate 207 will be discussed in further details herein later.

A substrate discussed herein, such as the substrate 207, may be capable of providing electrical communications between an electrical component, such as one or more integrated circuit (IC) dies, and a next-level component to which an IC package may be coupled (e.g., a circuit board). In an example, a substrate may comprise any suitable type of substrate capable of providing electrical communication between an IC die and an upper IC package coupled with a lower IC/die package, and in a further example a substrate may comprise any suitable type of substrate capable of providing electrical communication between an upper IC package and a next-level component to which an IC package is coupled. A substrate may also provide structural support for a die. By way of example, in one embodiment, a substrate may comprise a multi-layer substrate - including alternating layers of a dielectric material and metal built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases). In an example, a substrate is a cored or coreless package substrate, may include epoxy resins, FR4, one or more semiconductor interposers (e.g., silicon), etc.

In some embodiments, the first die 205a includes application circuitries 211a, and the second die 205b includes application circuitries 211b. The circuitries 211a, 211b may be any appropriate circuitries that may receive voltage supplied by the VR 100 (e.g., circuitries 211 may be coupled to Vout 114). Merely as examples, individual ones of the circuitries 211a, 211b may be a processor, a central processing unit (CPU), a graphic processing unit (GPU), a memory, a communication interface, communication buses, interconnect fabric, phase locked loop (PLL), a cache, a system on a chip (SOC), and/or any appropriate component(s) of a computing device. For example, the VR 100 may be a fully integrated VR (FIVR), where sections the VR 100 may be integrated within one or more application dies that include the application circuitries 211a and/or 211b.

In some embodiments, the VR 100 is portioned in between the dies 205a, 205b, and the substrate 207. The partitioning illustrated in FIG. 2 (as well as various other figures) are mere examples, and do not limit the teachings of this disclosure. For example, the VR 100 may be partitioned in a manner different from those illustrated in various figures of this disclosure.

In some embodiments, one or more passive components of the VR 100, such as one or more of the capacitors 108a, 108b, inductors 112, are on, or embedded within, the substrate 207. Thus, one or more passive components of the VR 100 may be external to the dies 205a, 205b. For example, the inductor 112 may be on, or at least in part embedded within, the substrate 207. In an example, the inductor 112 may be on package traces that are on or within the substrate 207. In another example, the inductor 112 may be air core inductor (ACI) on the substrate 207.

However, in some other embodiments (and although not illustrated in FIG. 2), a passive component (e.g., the inductor 112) is included in one of the dies 205a, 205b. For example, the inductor 112 may include a through substrate via (TSV) inductor that is formed on one of the dies 205a, 205b, e.g., a spiral inductor based on TSV technology.

In some embodiments, the switches 106a1, 106a2, 106a3, 106b1, 106b2, 106b3 are divided between the dies 205a, 205b. As an example, the switches 106a1, 106a2, 106a3 are be included in the die 205a, and the switches 106b1, 106b2, 106b3 are included in the die 205b. For example, in the VR 100 of FIG. 1, the switches 106a1, 106a2, 106a3 are on a same side (e.g., left side) of the VR 100 and are adjacent (e.g., coupled in series)—these switches are clubbed in the die 205a. Similarly, in the VR 100 of FIG. 1, the switches 106b1, 106b2, 106b3 are on a same side (e.g., right side) of the VR and are adjacent (e.g., coupled in series)—these switches are clubbed in the die 205b.

In some embodiments, driver circuitries 122 of the VR 100 are divided between the dies 205a, 205b, e.g., based on the division of the corresponding switches 106 between the dies 205a, 205b. For example, driver circuitries 122a1, 122a2, 122a3 corresponding to the switches 106a1, 106a2, 106a3 are included in the die 205a, and driver circuitries 122b1, 122b2, 122b3 corresponding to the switches 106b1, 106b2, 106b3 are included in the die 205b.

In some embodiments, sense circuitries 118 of the VR 100 are divided between the dies 205a, 205b, e.g., based on the division of the corresponding switches 106 between the dies 205a, 205b. For example, sense circuitries 118a1, 118a2, 118a3 corresponding to the switches 106a1, 106a2, 106a3 are included in the die 205a, and sense circuitries 118b1, 118b2, 118b3 corresponding to the switches 106b1, 106b2, 106b3 are included in the die 205b.

In some embodiments, the feedback circuitry 126 is included in any of the dies 205a, 205b (e.g., hence illustrated using dotted lines). In an example, the feedback circuitry 126 may be split or partitioned between two sections, with one section in the die 205a, and another section in the die 205b.

In an example, the controller 130 may be partitioned in two sections 130a, 130b, with one section 130a in the die 205a, and another section 130b in the die 205b. In another example, the controller 130 is not partitioned, and is included (e.g., in substantially its entirety) in any of the dies 205a, 205b.

Thus, the PM circuitry 134 (e.g., including the driver circuitries 122, the sense circuitries 118, the feedback circuitry 126, the controller 130, etc.) is partitioned in two sections 136a, 136b, as illustrated in FIGS. 1 and 2. As illustrated in FIG. 2, the section 136a of the PM circuitry 134 is included in the die 205a, and the section 136b of the PM circuitry 134 is included in the die 205b.

Figure 3:
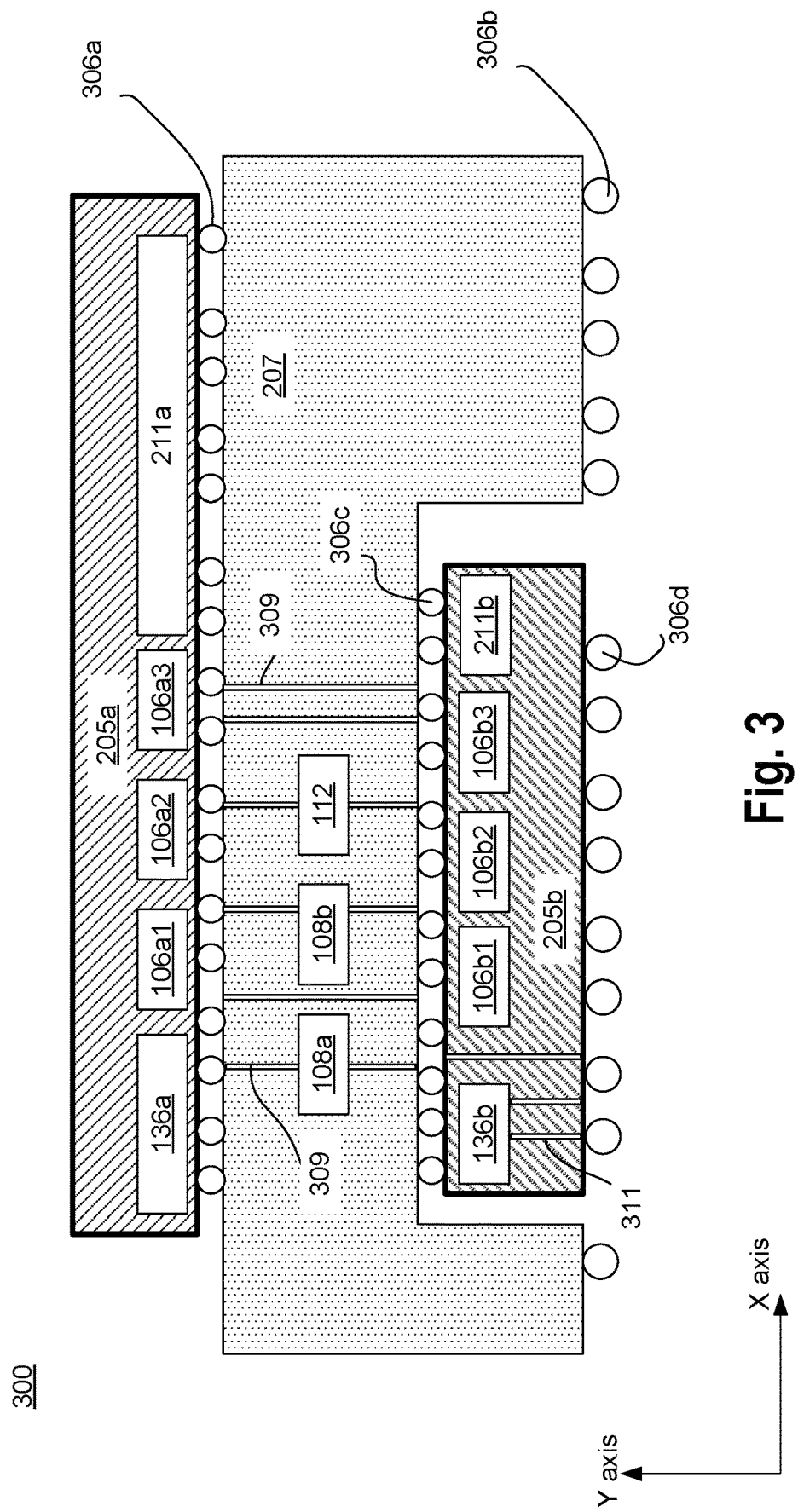
FIG. 3 illustrates an example implementation of the semiconductor package of FIG. 2, according to some embodiments.

FIG. 3 illustrates an example implementation 300 of the semiconductor package 200 (also referred to as package 200) of FIG. 2, according to some embodiments. Referring to FIGS. 2-3, the die 205a may include the switches 106a1, 106a2, 106a3, and the section 136a of the PM circuitry 134. The die 205b may include the switches 106b1, 106b2, 106b3, and the section 136b of the PM circuitry 134. In an example, the die 205a includes the application circuitries 211a, and the die 205b includes the application circuitries 211b.

In some embodiments, the package 200 includes the substrate 207. The die 205a is coupled to the substrate 207 via a plurality of interconnect structures 306a. The interconnect structures 306a, for example, are bumps, bump pads, metal pillars (e.g., copper pillars), balls formed using metals, alloys, solderable material, or the like. The interconnect structures 306a, for example, are solder formed using metals, alloys, solderable material, or the like.

The die 205a is on a first side of the substrate 207. A second side of the substrate 207, which is opposite the first side, has a recess or cavity, and the die 205*b* is at least in part within the recess. The die 205*b* is coupled to the recessed portion of the second side of the substrate 207 via a plurality of interconnect structures 306*c*. The un-recessed region of the second side of the substrate 207 includes a plurality of interconnect structures 306*b*, and a bottom side of the die 205*b* (e.g., the bottom side of the die 205*b* may be opposite a side that is coupled to the substrate 207) includes a plurality of interconnect structures 306*d*. The interconnect structures 306*b*, 306*c*, 306*d*, for example, may be bumps, bump pads, metal pillars (e.g., copper pillars), balls formed using metals, alloys, solderable material, and/or the like. The interconnect structures 306, for example, are solder formed using metals, alloys, solderable material, and/or the like. The interconnect structures 306*b*, 306*d* may be used to couple the package 300 to one or more external components (e.g., components that are external to the package 300), such as a motherboard, a circuit board, etc. The die 205*b* may include a plurality of TSVs 311, which may couple one or more components of the die 205*b* to the interconnect structures 306*d*, and/or which may be coupled with the interconnect structures 306*c* and 306*d*.

The passive components of the VR 100, e.g., capacitors 108*a*, 108*b*, inductor 112, etc. may be on, or embedded within, the substrate 207. Individual ones of the passive components may be coupled to one or both the dies 205*a*, 205*b* via one or more of TSVs 309 that extend through the substrate 207. One or more of the TSVs 309 may also interconnect the dies 205*a* and 205*b*.

Figure 4:
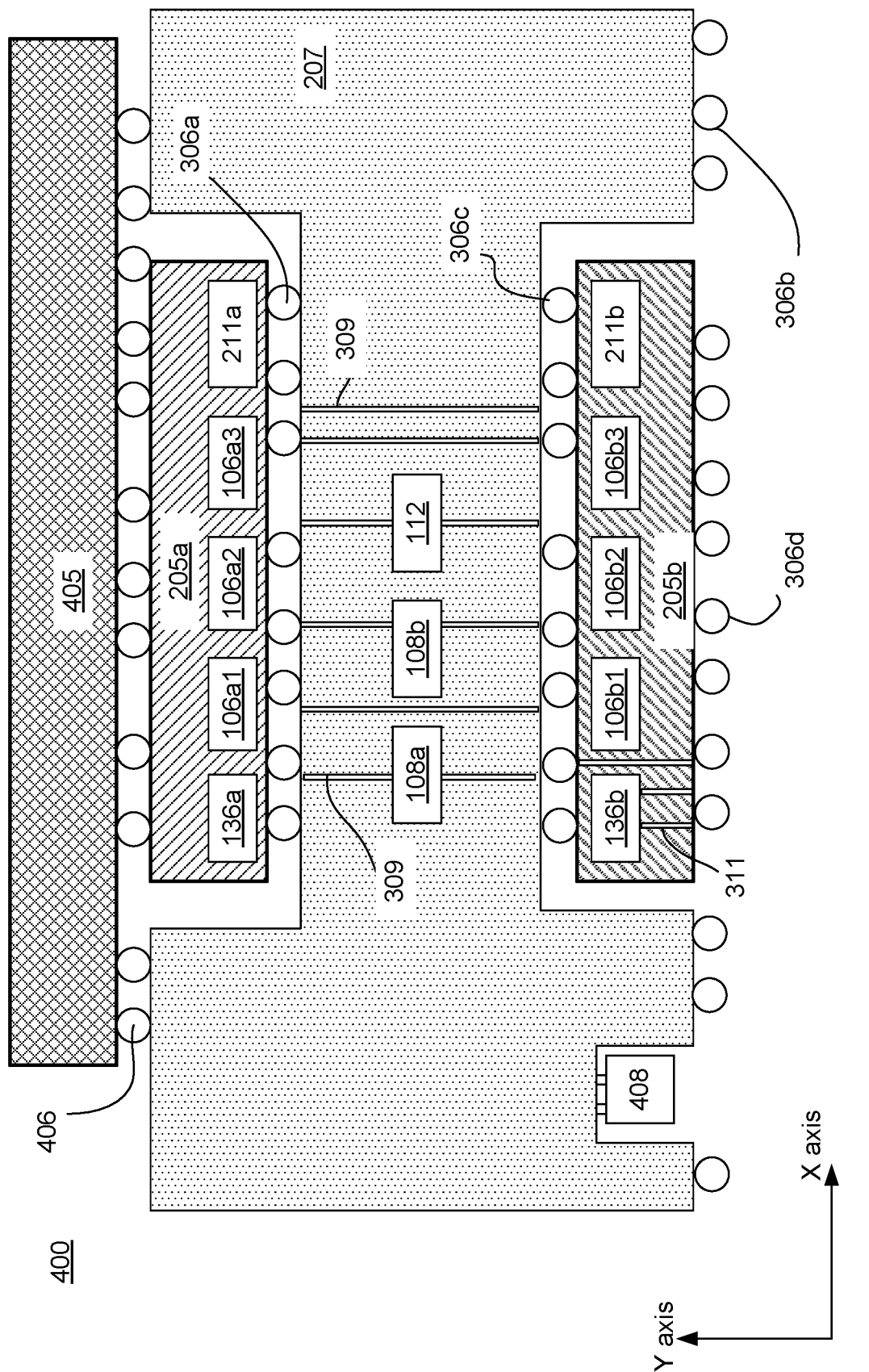
FIG. 4 illustrates another example implementation of the semiconductor package of FIG. 2, according to some embodiments.

FIG. 4 illustrates another example implementation 400 of the semiconductor package 200 (also referred to as package 200) of FIG. 2, according to some embodiments. Referring to FIGS. 2 and 4, the die 205*a* may include the switches 106*a*1, 106*a*2, 106*a*3, and the section 136*a* of the PM circuitry 134. The die 205*b* may include the switches 106*b*1, 106*b*2, 106*b*3, and the section 136*b* of the PM circuitry 134. In an example, the die 205*a* includes the application circuitries 211*a*, and the die 205*b* includes the application circuitries 211*b*.

In some embodiments, the package 200 includes the substrate 207. The die 205*a* is coupled to the substrate 207 via the plurality of interconnect structures 306*a*. The die 205*a* may be at least in part within a recess on a first side of the substrate 207. The interconnect structures 306*a*, for example, are bumps, bump pads, metal pillars (e.g., copper pillars), balls formed using metals, alloys, solderable material, or the like. The interconnect structures 306*a*, for example, are solder formed using metals, alloys, solderable material, or the like.

The die 205*a* may be on the first side of the substrate 207. A second side of the substrate 207, which may be opposite the first side, may have at least two recesses, and the die 205*b* may be at least in part within a first recess. The die 205*b* may be coupled to the recessed portion of the second side of the substrate 207 via a plurality of interconnect structures 306*c*. A passive element 408 (e.g., which may be one of a capacitor or an inductor of the VR 100, or which may be another passive component of the package 400) may be within the second recess.

The un-recessed region of the second side of the substrate 207 may include a plurality of interconnect structures 306*b*, and a bottom side of the die 205*b* (e.g., the bottom side of the die 205*b* may be opposite a side that is coupled to the substrate 207) may include a plurality of interconnect structures 306*d*. The interconnect structures 306*b*, 306*c*, 306*d*, for example, are bumps, bump pads, metal pillars (e.g., copper pillars), balls formed using metals, alloys, solderable material, and/or the like. The interconnect structures 306, for example, are solder formed using metals, alloys, solderable material, and/or the like. The interconnect structures 306*b*, 306*d* may be used to couple the package 300 to one or more external components (e.g., components that are external to the package 300). The die 205*b* may include a plurality of TSVs 311, which may couple one or more components of the die 205*b* to the interconnect structures 306*d*, and/or which may be coupled with the interconnect structures 306*c* and 306*d*.

One or more of the passive components of the VR 100, e.g., capacitors 108*a*, 108*b*, inductor 112, etc. may be on, or embedded within, the substrate 207. Individual ones of the passive components may be coupled to one or both the dies 205*a*, 205*b* via one or more of TSVs 309 that extend through the substrate 207. One or more of the TSVs 209 may also interconnect the dies 205*a* and 205*b*.

In some embodiments, the package 400 further includes a die 405, which may be on the first side of the substrate 207 and on a top side of the die 205*a*. The die 405 may be coupled to the first side of the substrate 207 and the top side of the die 205*a* via a plurality of interconnect structures 406. The interconnect structures 406, for example, are bumps, bump pads, metal pillars (e.g., copper pillars), balls formed using metals, alloys, solderable material, and/or the like. The interconnect structures 406, for example, are solder formed using metals, alloys, solderable material, and/or the like.

In an example, the die 405 may not include components of the VR 100. In another example, the die 405 may include one or more components of the VR 100, although such components are not illustrated in FIG. 4. In an example, the die 405 includes one or more application circuitries, although not illustrated in FIG. 4. The die 405 may receive power supply from the VR 100.

Figure 5:
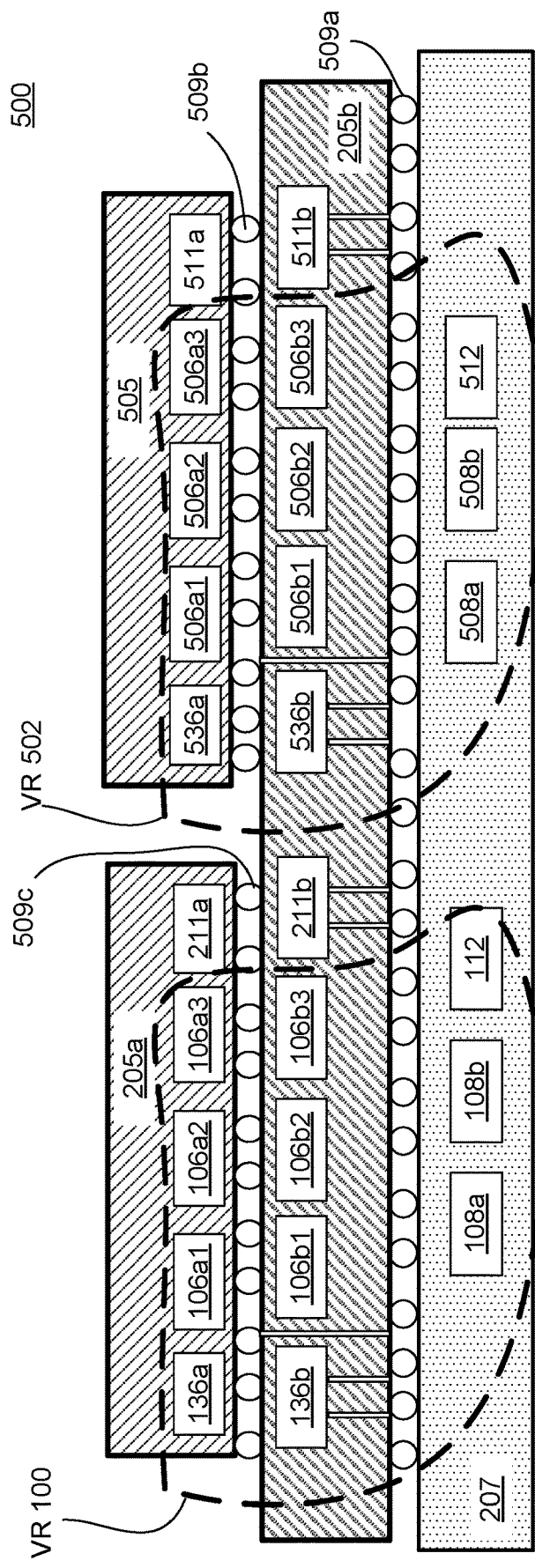
FIG. 5 illustrates another example implementation of the semiconductor package of FIG. 2, wherein the package of FIG. 5 includes a first VR and a second VR, according to some embodiments.

FIG. 5 illustrates another example implementation 500 of the semiconductor package 200 (also referred to as package 200) of FIG. 2, wherein the package 500 of FIG. 5 includes a first VR 100 of FIGS. 1 and 2 and also includes a second VR 502, according to some embodiments. Referring to FIGS. 2 and 5, the die 205*a* may include the switches 106*a*1, 106*a*2, 106*a*3, and the section 136*a* of the PM circuitry 134 of the VR 100. The die 205*b* may include the switches 106*b*1, 106*b*2, 106*b*3, and the section 136*b* of the PM circuitry 134 of the VR 100.

The package 500 includes the substrate 207. The die 205*b* is on the substrate 207, and the die 205*b* is coupled to the substrate 207 via a plurality of interconnect structures 509*a*. The die 205*a* is stacked on the die 205*b*, and the die 205*a* is coupled to the die 205*b* via a plurality of interconnect structures 509*c*. Another die 505 is also stacked on the die 205*b*, and the die 505 is coupled to the die 205*b* via a plurality of interconnect structures 509*b*. The interconnect structures 509, for example, are bumps, bump pads, metal pillars (e.g., copper pillars), balls formed using metals, alloys, solderable material, or the like. The interconnect structures 509, for example, are solder formed using metals, alloys, solderable material, or the like. The substrate 207 may be, for example, a motherboard, a printed circuit board, or the like.

In some embodiments, the substrate 207 includes passive components, such as the capacitors 108*a*, 108*b*, and inductor 112 of the VR 100. Various components of the VR 100 are included within a dotted line, which is labelled as VR 100.

The VR 502 may have a structure that is at least in part similar to the structure of the VR 100 discussed with respect to FIGS. 1 and 2 (or any appropriate modifications thereof). For example, one or more switches 506*a*1, 506*a*2, 506*a*3 of the VR 502 may be included in the die 505, and one or more switches 506b1, 506b2, 506b3 of the VR 502 may be included in the die 205b. Similar to the sections 136a, 136b of the PM circuitry 134 of the VR 100, the VR 502 may have a PM circuitry 534 including sections 536a, 536b. The section 536a of the PM circuitry 534 of the VR 502 may be included in the die 505, and the section 536b of the PM circuitry 534 of the VR 502 may be included in the die 205b. In some embodiments, the substrate 207 includes passive components, such as the capacitors 508a, 508b, and inductor 512 of the VR 502. Various components of the VR 502 are included within a dotted line, which is labelled as VR 502.

Thus, the die 205a includes a section of the VR 100, the die 505 includes a section of the VR 502, and the die 205b includes another section of the VR 100 and another section of the VR 502. In an example, the die 205a includes the application circuitries 211a, the die 205b includes application circuitries 211b, 511b, and the die 505 includes application circuitries 511b. The VR 100 may supply power to the application circuitries 211a, 211b, and the VR 502 may supply power to the application circuitries 511a, 511b.

Figure 6:
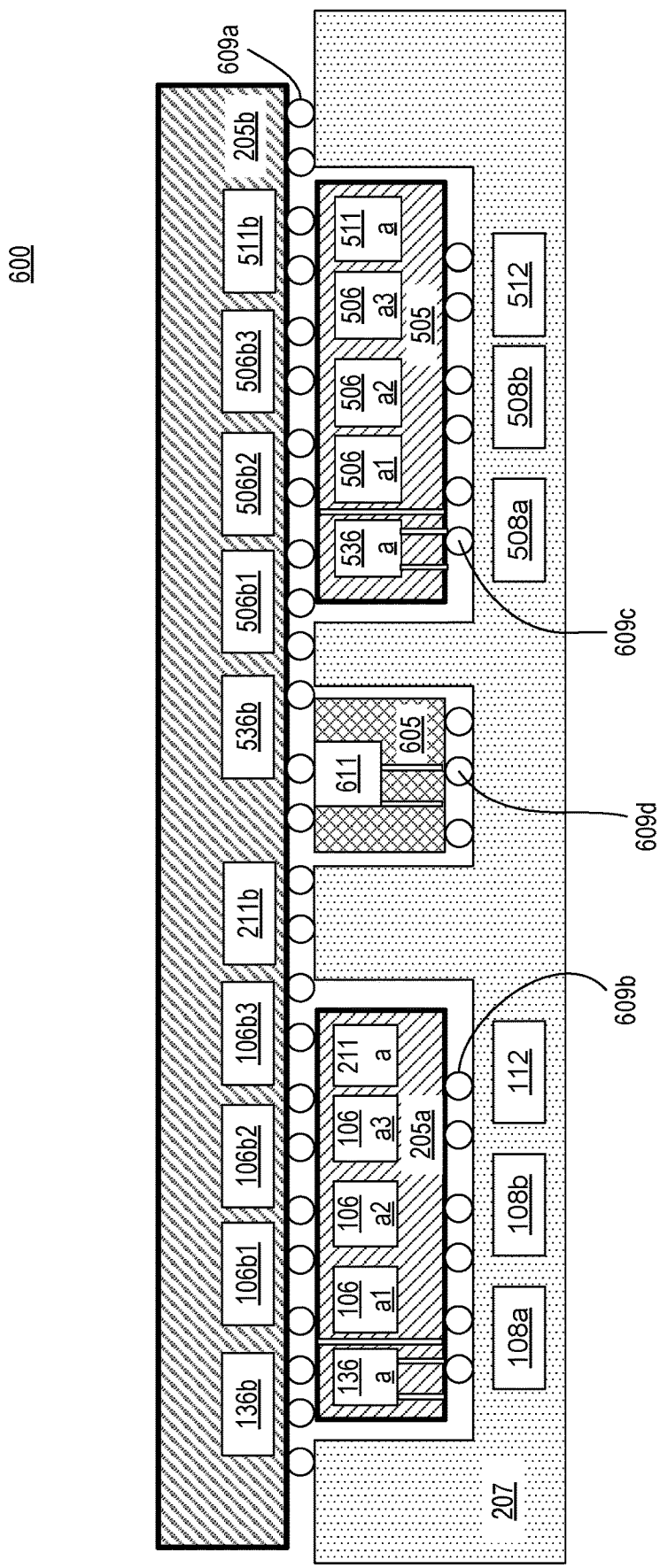
FIG. 6 illustrates another example implementation of the semiconductor package of FIG. 2, wherein the package of FIG. 6 includes a first VR and a second VR, according to some embodiments.

FIG. 6 illustrates another example implementation 600 of the semiconductor package 200 (also referred to as package 200) of FIG. 2, wherein the package 600 of FIG. 6 includes a first VR 100 of FIGS. 1 and 2 and also includes the second VR 502 (e.g., as discussed with respect FIG. 5), according to some embodiments. Referring to FIGS. 2 and 6, the die 205a may include the switches 106a1, 106a2, 106a3, and the section 136a of the PM circuitry 134 of the VR 100. The die 205b may include the switches 106b1, 106b2, 106b3, and the section 136b of the PM circuitry 134 of the VR 100.

In some embodiments, the VR 502 includes switches 506a1, 506a2, and 506a3 within the die 505, and switches 506b1, 506b2, and 506b3 within the die 205b. The PM circuitry 534 of the VR 502 may include sections 536a, 536b, where the section 536a may be included in the die 505 and the section 536b may be included in the die 205b.

The package 500 includes the substrate 207. The substrate 207 may have at least three recessed regions on a first side. The die 205a may be at least in part within a first recess region of the substrate 207. The die 505 may be at least in part within a second recess region of the substrate 207. A die 611 may be at least in part within a third recess region of the substrate 207. The die 205b may be on the dies 205a, 611, 505 and on the un-recessed region of the first side of the substrate 207.

The die 205b (e.g., an active side of the die 205a) may be coupled to the substrate 207 and to the dies 611, 205a, 505 (e.g., active sides of the dies 611, 205a, 505) via a plurality of interconnect structures 609a. The die 205a may be coupled to the substrate 207 via a plurality of interconnect structures 609b. The die 505 may be coupled to the substrate 207 via a plurality of interconnect structures 609c. The die 611 may be coupled to the substrate 207 via a plurality of interconnect structures 609d. The interconnect structures 609, for example, are bumps, bump pads, metal pillars (e.g., copper pillars), balls formed using metals, alloys, solderable material, or the like. The interconnect structures 609, for example, are solder formed using metals, alloys, solderable material, or the like. The substrate 207 may be, for example, a motherboard, a printed circuit board, or the like.

In some embodiments, the substrate 207 includes passive components, such as the capacitors 108a, 108b, and inductor 112 of the VR 100. In some embodiments, the substrate 207 includes passive components, such as the capacitors 508a, 508b, and inductor 512 of the VR 502.

Thus, the die 205a includes a section of the VR 100, the die 505 includes a section of the VR 502, and the die 205b includes another section of the VR 100 and another section of the VR 502. The die 205b may include application circuitries 211b, 511b, the die 205a may include application circuitry 211a, the die 505 may include application circuitry 511a, and the die 611 may include application circuitry 611. The VR 100 may supply power to the application circuitries 211a, 211b, and the VR 502 may supply power to the application circuitries 511a, 511b. One or both the VRs 100 and 502 may supply power to the application circuitries 611.

Figure 7:
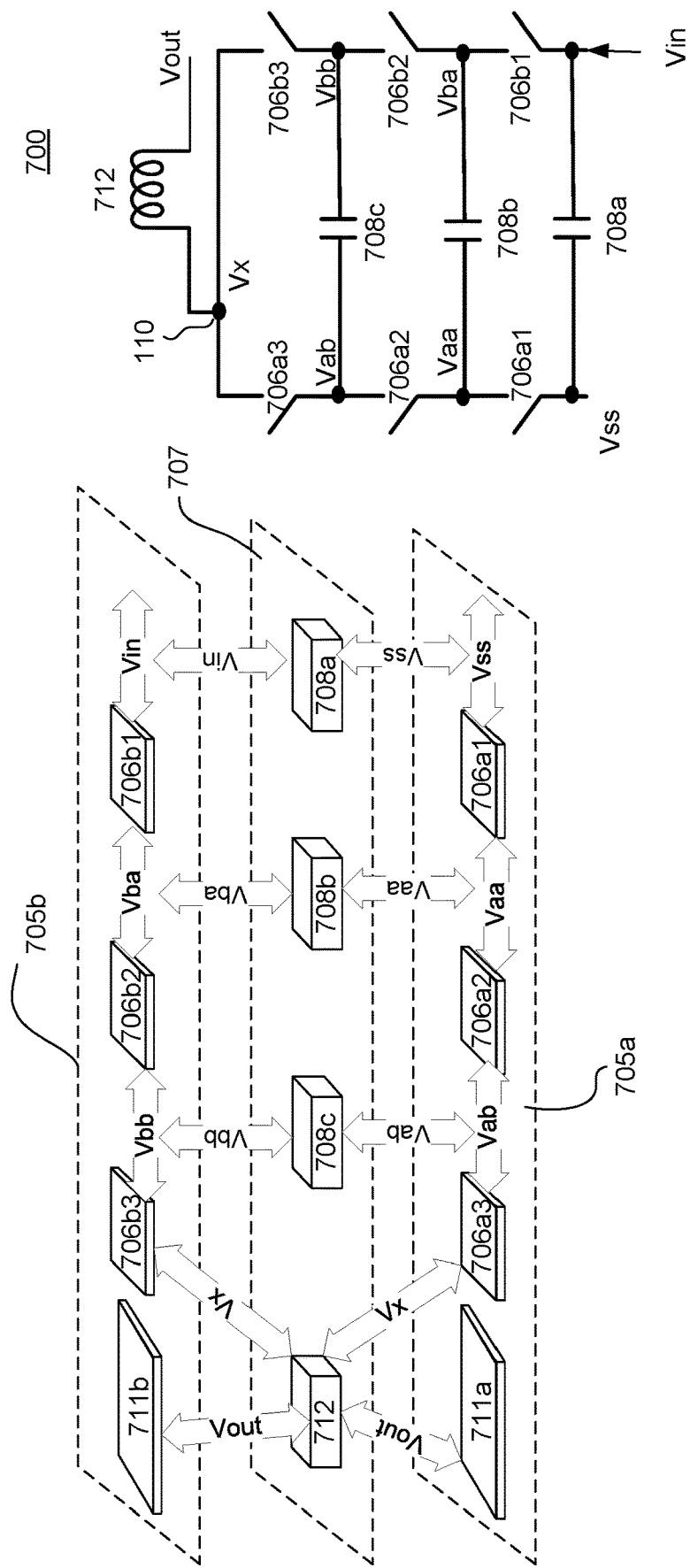
FIG. 7 schematically illustrates an example implementation of a VR, where various switches and passive components of the VR are distributed among a first die, a second die, and a substrate, according to some embodiments.

FIG. 7 schematically illustrates an example implementation of a VR 700, where various switches 706 and passive components (e.g., capacitors 708a, 708b, 708c, inductor 712) of the VR 700 are distributed among a first die 705a, a second die 705b, and a substrate 707, according to some embodiments. Right side of FIG. 7 illustrates an example circuitry of the VR 700, and left side of FIG. 7 symbolically illustrates the switches 706 and the passive components of the VR 700 being included in the dies 705 and the substrate 707 (boundaries of the dies 705 and the substrate 707 are symbolically illustrated using dashed lines). The circuitry of the VR 700 is merely an example, and any appropriate modifications to the circuitry may be envisioned by those skilled in the art. The circuitry of the VR 700 will be evident based on the circuitry of the VR 100 of FIG. 1.

Although the VR 700 includes a PM circuitry (e.g., which may, or may not, be similar to the PM circuitry 134 of FIG. 1), such a PM circuitry is not illustrated in FIG. 7. Voltages of various nodes of the VR 700, e.g., voltages Vab, Vaa, Vbb, Vba, Vx, input voltage Vin, output voltage Vout, input voltage Vss (which may be coupled to the ground in an example), are also illustrated.

As illustrated in FIG. 7, the series coupled switches 706a1, 706a2, 706a3 are included in the die 705a, the series coupled switches 706b1, 706b2, 706b3 are included in the die 705b, and the passive components (e.g., capacitors 708a, 708b, 708c, inductor 712) are included in the substrate 707. The dies 705a, 705b respectively include application circuitries 711a, 711b, individual ones of which receives the output voltage Vout from the VR 700. In the example of FIG. 7, the components of the VR 700 may be strategically laid out to reduce routing distances between the components.

Figure 8:
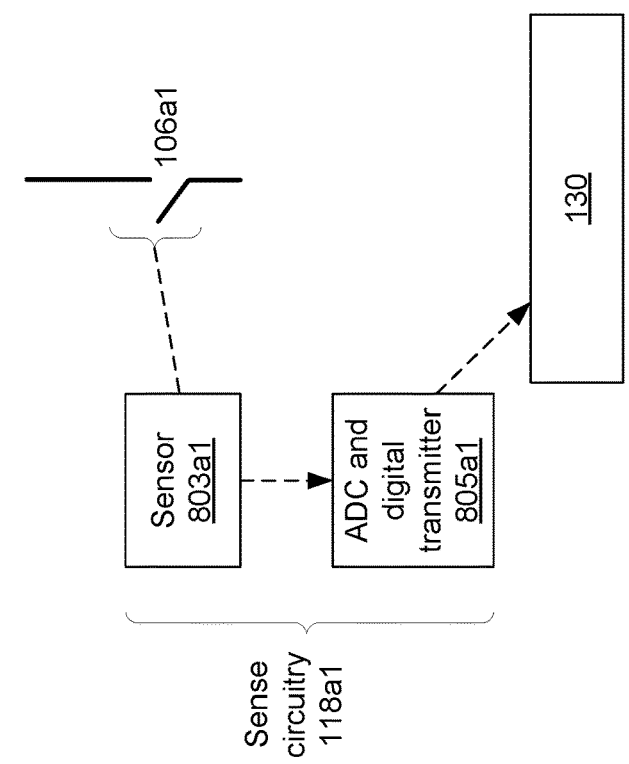
FIG. 8 illustrates a sense circuitry of a VR, where the sense circuitry includes a digital section and an analog section, according to some embodiments.

FIG. 8 illustrates a sense circuitry 118a1 of the VR 100 of FIG. 1, where the sense circuitry 118a1 includes a digital section and an analog section, according to some embodiments. For example, the sense circuitry 118a1 may measure a voltage and/or a current of the switch 106a1, as discussed with respect to FIG. 1. In an example, the sense circuitry 118a1 may include a sensor 803a1 (e.g., which may be an analog sensor) to measure the voltage and/or current of the switch 106a1. An output of the sensor 803a1 may be transmitted to a digital component 805a1 of the sense circuitry 118a1, which may include an Analog to Digital converter (ADC) and/or a digital transmitter. The component 805a1 may convert the analog measurements in corresponding digital form, and transmit the digital sensed voltage and/or current to the controller 130.

Figure 9:
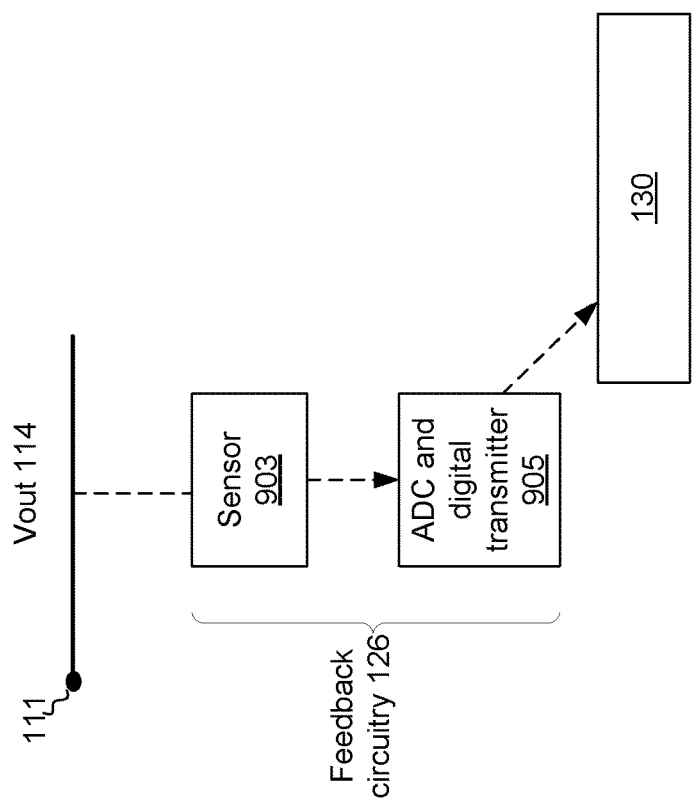
FIG. 9 illustrates a feedback circuitry of a VR, where the feedback circuitry includes a digital section and an analog section, according to some embodiments.

FIG. 9 illustrates a feedback circuitry 126 of the VR 100 of FIG. 1, where the feedback circuitry 126 includes a digital section and an analog section, according to some embodiments. For example, the feedback circuitry 126 may measure the output voltage Vout 114 of the VR 100, as discussed with respect to FIG. 1. In an example, the feedback circuitry 126 may include a sensor 903 (e.g., which may be an analog sensor) to measure the output voltage Voout 114. An output of the sensor 903 may be transmitted to a digital component 905 of the feedback circuitry 126, which may be an ADC and/or a digital transmitter. The component 905 may convert the analog measurement in corresponding digital form, and transmit the digital sensed voltage and/or current to the controller 130.

Referring again to FIG. 2, components of the PM circuitry 134 were divided in sections 136a, 136b, e.g., based on locations of the components. For example, the sense circuitries 122a1, 122a2, 122a3 were clubbed with the corresponding switches 106a1, 106a2, 106a3 within the die 205a; and the sense circuitries 122b1, 122b2, 122b3 were clubbed with the corresponding switches 106b1, 106b2, 106b3 within the die 205b. For example, as the sense circuitry 122a1 were to sense voltage and/or current of the switch 106a1, the sense circuitry 122a1 and the switch 106a1 were arranged in the same die 205a.

However, in some embodiments, instead of arranging the components of the VR based on the logical locations of the components (such as in FIG. 2), the components of a VR can be arranged based on technologies used for individual components, types of the dies, etc. For example, a VR may be partitioned in two dies, with a first die being a logic die (e.g., a low voltage die with technology geared primarily towards high speed digital or logic computation), and a second die being an analog die (e.g., a relatively high voltage die with technology geared primarily towards analog computing). For example, the logic die may be based on silicon technology, e.g., may include CMOS (Complementary metal-oxide-semiconductor) circuitries. Merely as an example, a processor or an application circuitry may be within the logic die. The analog die may be based on high bandgap technology, e.g., having transistors that use high bandgap material. For example, the analog die may have transistors that include compound semiconductors, e.g., transistors employing type III-V compound semiconductor materials. Examples of type III-V compound semiconductor materials include, but are not limited to, Gallium Nitride (GaN), Gallium arsenide (GaAs), Indium nitride (InN), Indium phosphide (InP), Indium arsenide (InAs), Silicon carbide (SiC), Indium gallium arsenide (InGaAs), Indium arsenide (InAs), etc.

Thus, the logic die may be optimized primarily for logic or digital circuitries, and the analog die may be optimized primarily for analog circuitries. In such scenarios, digital components of a PM circuitry of a VR may be within the logic die, whereas analog components of the PM circuitry of the VR may be within the analog die, e.g., as discussed herein below with respect to FIGS. 10-11.

Figure 10:
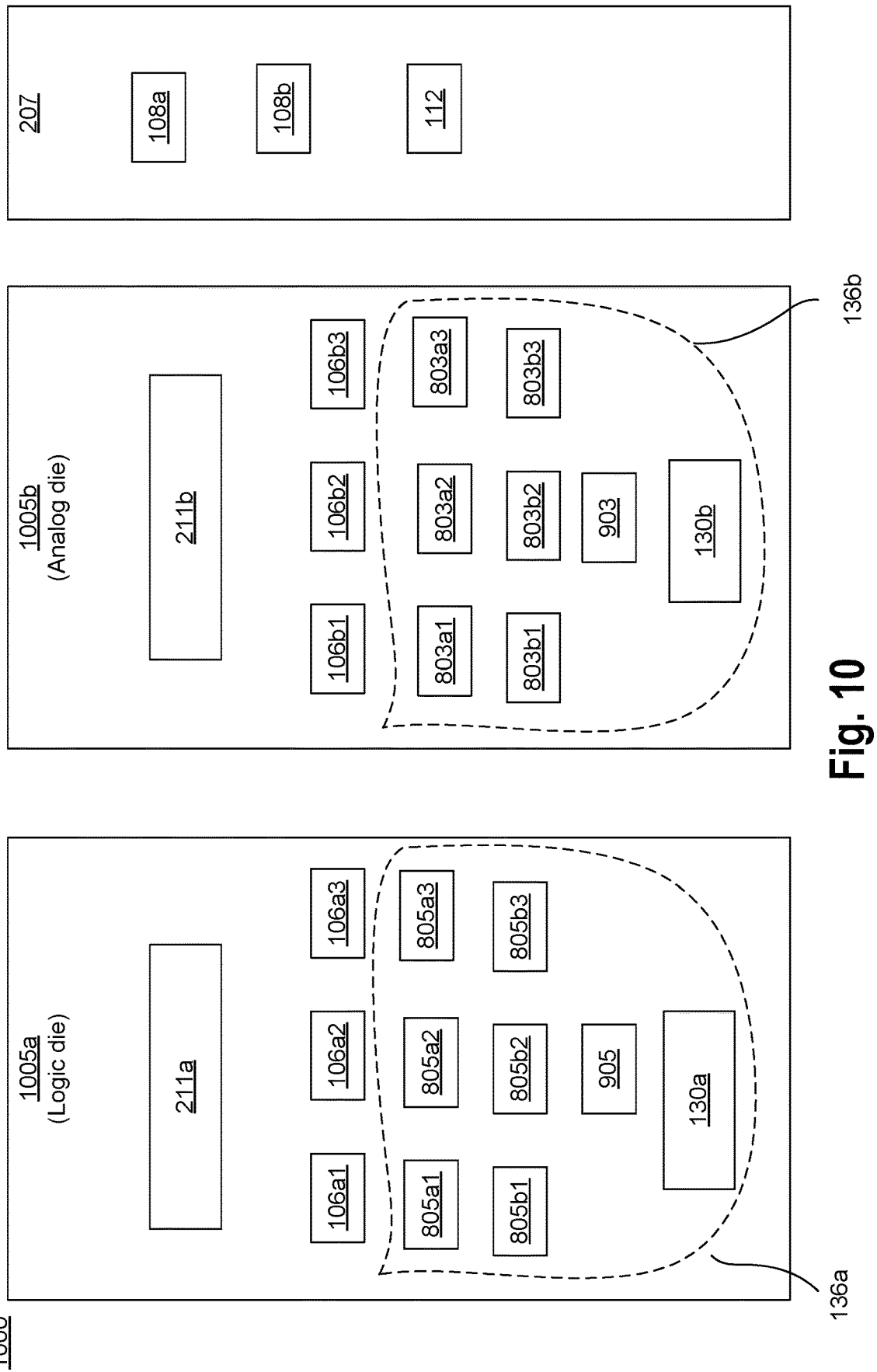
FIG. 10 illustrates a semiconductor package including a first die (e.g., which may be a logic die), a second die (e.g., which may be an analog die), and a substrate, where a VR is partitioned among the first die, the second die, and the substrate, according to some embodiments.

FIG. 10 illustrates a semiconductor package 1000 including a first die 1005a (e.g., which may be a logic die), a second die 1005b (e.g., which may be an analog die), and a substrate 207 (where the dies 1005 and the substrate 207 are merely symbolically illustrated in FIG. 10), where the VR 100 of FIG. 1 is partitioned among the first die 1005a, the second die 1005b, and the substrate 207, according to some embodiments. FIG. 10 is at least in part similar to FIG. 2. However, unlike FIG. 2 where the components of the PM circuitry 134 were partitioned among the dies 205 based on a location of the components, the components of the PM circuitry 134 in FIG. 7 are partitioned based at least in part on the technology used to implement individual components of the VR.

For example, the analog section 803a1 of the sense circuitry 118a1 (e.g., see FIG. 8) may be included in the analog die 1005b, and the digital section 805a1 of the sense circuitry 118a1 may be included in the logic die 1005a. Similarly, the sense circuitries 118a2, 118a3, 118b1, 118b2, 118b3 may have corresponding analog and digital sections—an analog section 803 of a sense circuitry 118 may be included in the analog die 1005b, and a digital section 805 of the sense circuitry 118 may be included in the logic die 1005a.

In some embodiments, the analog section 903 of the feedback circuitry 126 (e.g., see FIG. 9) is included in the analog die 1005b, and the digital section 905 of the feedback circuitry 126 is included in the logic die 1005a.

For purposes of simplicity, locations of the driver circuitries 122 are not illustrated in FIG. 10. In some embodiments, the driver circuitries 122 are divided among the two dies based on location, as discussed with respect to FIG. 2. In some other embodiments, individual driver circuitry 122 are divided among the two dies based on technology used to implement the driver circuitry 122. For example, if a driver circuitry 122 has a digital section and an analog section, the digital section may be included in the logic die 1005a and the analog section may be included in the analog die 1005b. In another example, if a driver circuitry 122 has solely a digital section (but no analog section), the driver circuitry 122 may be included in the logic die 1005a. Thus, the inclusion of the driver circuitry 122 may be based on a specific implementation of the driver circuitry 122.

Thus, in some embodiments, the PM circuitry 134 of the VR 100 has analog sections (e.g., that are based on analog technology) and digital sections—the analog sections of the PM circuitry 134 are included in the analog die 1005b, and the digital sections of the PM circuitry 134 are included in the digital die 1005a. In some embodiments, the partitioning of the PM circuitry 134 (e.g., based on the technology used to implement individual components of the VR, as discussed with respect to FIG. 10) is at least in part implemented in any of the packages discussed herein, e.g., packages discussed with respect to FIGS. 3-7.

Figure 11:
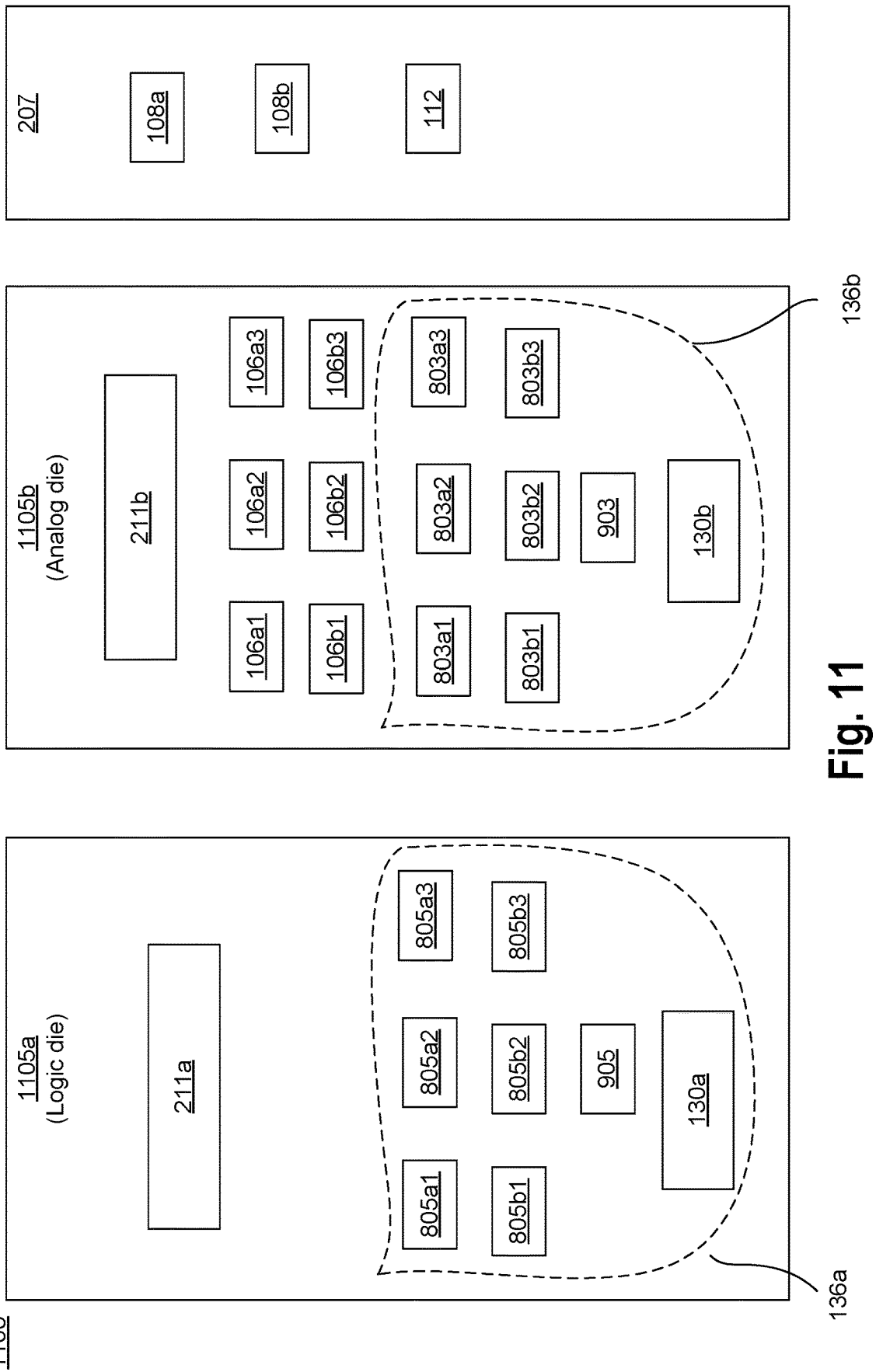
FIG. 11 illustrates another semiconductor package including a first die (e.g., which may be a logic die), a second die (e.g., which may be an analog die), and a substrate, where a VR is partitioned among the first die, the second die, and the substrate, e.g., based on technology used to implement individual components of the VR, according to some embodiments.

FIG. 11 illustrates a semiconductor package 1100 including a first die 1105a (e.g., which may be a logic die), a second die 1105b (e.g., which may be an analog die), and a substrate 207 (where the dies 1105 and the substrate 207 are merely symbolically illustrated in FIG. 11), where the VR 100 of FIG. 1 is partitioned among the first die 1105a, the second die 1105b, and the substrate 207, e.g., based on technology used to implement individual components of the VR, according to some embodiments.

FIG. 11 is at least in part similar to FIG. 10. For example, an analog section 803 of a sense circuitry 118 may be included in the analog die 1105b, and a digital section 805 of the sense circuitry 118 may be included in the logic die 1105a. In some embodiments, the analog section 903 of the feedback circuitry 126 (e.g., see FIG. 9) is included in the analog die 1105b, and the digital section 905 of the feedback circuitry 126 is included in the logic die 1105a. For purposes of simplicity, locations of the driver circuitries 122 are not illustrated in FIG. 11, as the discussion relating to the driver circuitries 122 with respect to FIG. 10 also applies to FIG. 11.

In some embodiments (and unlike FIG. 10), the switches 106 of the VR 100 are included in the same die in the semiconductor package 1100. For example, the switches 106 are power switches, and may be included in the analog die 1105b.

Thus, in some embodiments, the VR 100 has analog sections and digital sections—the analog sections of the PM circuitry 134 are included in the analog die 1105b, and the digital sections of the PM circuitry 134 are included in the digital die 1105a. In some embodiments, the partitioning of the PM circuitry (e.g., based on technology used to implement individual components, as discussed with respect to FIG. 11), is at least in part implemented in any of the packages discussed herein, e.g., packages discussed with respect to FIGS. 3-7.

In some embodiments, partitioning a VR across multiple dies (e.g., as discussed with respect to FIGS. 1-11) enables increased flexibility in routing across two-dimensional (2D) and three-dimensional (3D) package integration. VR components may be placed on different technologies that are more optimized for individual needs of the components (e.g., as discussed with respect to FIGS. 10-11). Furthermore, components may be strategically laid out to reduce routing distances (e.g., as illustrated in FIG. 7), which may reduce routing losses. Various embodiments and examples discussed herein may take full advantage of 3D integration, multi-die, and advanced VR topologies.

Figure 12:
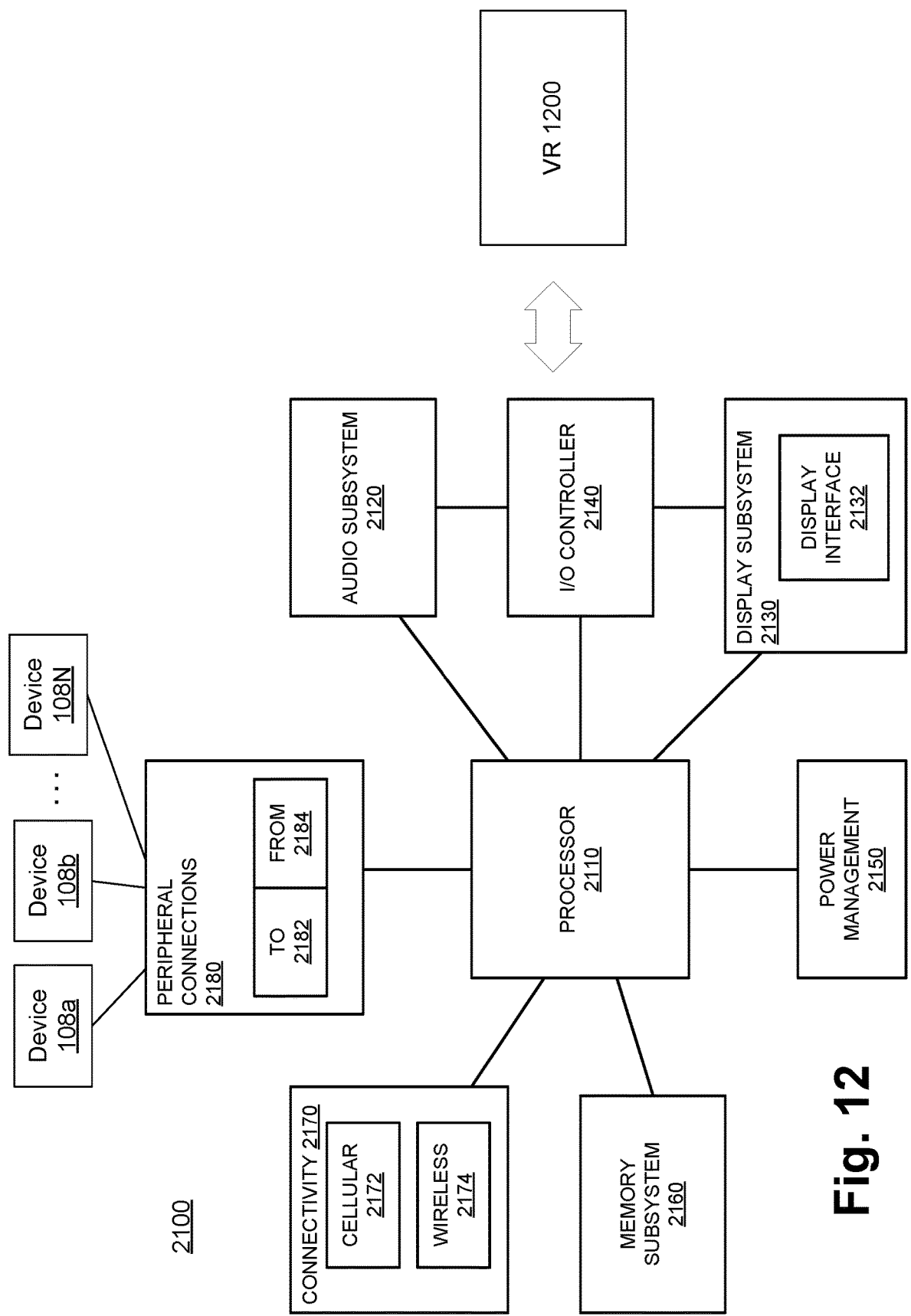
FIG. 12 illustrates a computer system, a computing device or a SoC (System-on-Chip), where the computing device includes a VR that is partitioned in multiple dies, and where at least one die of the multiple dies includes one or more application circuitries, according to some embodiments.

FIG. 12 illustrates a computer system, a computing device or a SoC (System-on-Chip) 2100, where the computing device includes a VR 1200 that is partitioned in multiple dies, wherein at least one die of the multiple dies includes one or more application circuitries (e.g., a processor, a memory, a communication interface, and/or other components of the computing device 2100), according to some embodiments. It is pointed out that those elements of FIG. 12 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 includes a VR 1200, which may correspond to any one of VRs discussed in this disclosure, e.g., with respect to FIGS. 1-11. Although not illustrated in FIG. 12, the VR 1200 may be partitioned into multiple dies of the computing device 2100 (e.g., the multiple dies are not illustrated in FIG. 12, but examples of such dies are illustrated in various other figures). At least one die of the multiple dies includes one or more application circuitries, e.g., a processor, a memory, a communication interface, and/or other components of the computing device 2100.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the example clauses may be used anywhere in one or more embodiments. All optional features of the apparatus described herein may also be implemented with respect to a method or process.

Example 1. A semiconductor package comprising: a first die comprising a first section of a power converter; and a second die comprising a second section of the power converter, wherein the power converter comprises: a plurality of switches, and a Power Management (PM) circuitry to control operation of the power converter by controlling switching of the plurality of switches, wherein the PM circuitry comprises a first part and a second part, wherein the first section of the power converter in the first die includes the first part of the PM circuitry, and wherein the second section of the power converter in the second die includes the second part of the PM circuitry.

Example 2. The semiconductor package of example 1, wherein the PM circuitry comprises: a plurality of sense circuitries, wherein an individual sense circuitry of the plurality of sense circuitries is to sense one or both of a voltage or a current of a corresponding switch of the plurality of switches, wherein the first part of the PM circuitry in the first die includes a first subset of the plurality of sense circuitries, and, wherein the second part of the PM circuitry in the second die includes a second subset of the plurality of sense circuitries.

Example 3. The semiconductor package of any of examples 1-2, wherein the PM circuitry comprises: a controller; and a sense circuitry to sense a parameter of a corresponding switch, and transmit the sensed parameter to the controller, wherein the first part of the PM circuitry in the first die includes a first portion of the sense circuitry, which is to sense the parameter of the switch, and wherein the second part of the PM circuitry in the second die includes a second portion of the sense circuitry, which is to transmit the sensed parameter to the controller.

Example 4. The semiconductor package of example 3, wherein the second part of the sense circuitry comprises an analog to digital converter (ADC) to digitalize the sensed parameter for transmission to the controller.

Example 5. The semiconductor package of any of examples 1-4, wherein:
the first section of the power converter in the first die includes a first subset of the plurality of switches; and the second section of the power converter in the second die includes a second subset of the plurality of switches.

Example 6. The semiconductor package of any of examples 1-5, wherein the PM circuitry comprises: a plurality of driver circuitries, wherein an individual driver circuitry of the plurality of driver circuitries is to drive a corresponding switch of the plurality of switches, wherein the first section of the power converter in the first die includes a first subset of the plurality of driver circuitries, and wherein the second section of the power converter in the second die includes a second subset of the plurality of driver circuitries.

Example 7. The semiconductor package of any of examples 1-6, comprising: a substrate, wherein at least one of the first or second dies is on the substrate, wherein the power converter comprises a plurality of passive components, and wherein one or more of the plurality of passive components are on, or embedded within, the substrate.

Example 8. The semiconductor package of any of examples 1-7, wherein the PM circuitry comprises: a controller; and a feedback circuitry to measure an output voltage of the power converter, and transmit the measured voltage to the controller, wherein the first part of the PM circuitry in the first die includes a first portion of the feedback circuitry, which is to measure the output voltage; and wherein the second part of the PM circuitry in the second die includes a second portion of the feedback circuitry, which is to digitalize the measurement of the output voltage and transmit the digitalized measurement of the output voltage to the controller.

Example 9. The semiconductor package of any of examples 1-8, wherein the PM circuitry comprises: a plurality of analog components; and a plurality of digital components, wherein the first part of the PM circuitry in the first die includes the plurality of analog components; and wherein the second part of the PM circuitry in the second die includes the plurality of digital components.

Example 10. The semiconductor package of any of examples 1-9, further comprising: a substrate, wherein one or more passive components of the power converter are on, or embedded within, the substrate, wherein the substrate has a first side and a second side that is opposite the first side, wherein the substrate has a recess on the second side, wherein the first die is on the first side of the substrate, and wherein the second die is at least in part within the recess on the second side of the substrate.

Example 11. The semiconductor package of example 10, wherein: the recess is a first recess; the substrate has a second recess on the first side, wherein the first die is at least in part within the second recess on the first side of the substrate.

Example 12. The semiconductor package of any of examples 1-11, further comprising: a substrate, wherein one or more passive components of the power converter are on, or embedded within, the substrate, wherein the first die is on the substrate, and wherein the second die is stacked on the first die.

Example 13. The semiconductor package of example 12, wherein: the substrate has a recess, such that the first die is at least in part within the recess.

Example 14. The semiconductor package of any of examples 1-13, wherein the power converter is a first power converter, and wherein the semiconductor package further comprises: a third die comprising a first section of a second power converter, wherein one of the first die or the second die comprises a second section of the second power converter.

Example 15. A system comprising: a first die comprising one or more of: a memory to store instructions, a processor to execute the instructions, or a wireless interface to facilitate communication between the processor and another system, the first die further comprising a first section of a Voltage Regulator (VR); and a second die comprising a second section of the VR, wherein the VR comprises: a plurality of switches, and a Power Management (PM) circuitry to control operation of the VR by controlling switching of the plurality of switches, wherein the PM circuitry comprises a first part and a second part, wherein the first section of the VR in the first die includes the first part of the PM circuitry, and wherein the second section of the VR in the second die includes the second part of the PM circuitry.

Example 16. The system of example 15, further comprising: a power supply to supply power to the system; and a substrate comprising one or more passive components of the VR, wherein at least one of the first or second dies is on the substrate.

Example 17. A Voltage Regulator (VR) comprising: a passive component; first and second switches coupled to a first terminal of the passive component; third and fourth switches coupled to a second terminal of the passive component; first, second, third and fourth drivers to respectively control switching of the first, second, third and fourth switches, wherein the first switch, the second switch, the first driver, and the second driver are included in a first die, wherein the third switch, the fourth switch, the third driver, and the fourth driver are included in a second die, and wherein the passive component is external to the first and second dies.

Example 18. The VR of example 17, wherein the passive components is at least one of a capacitor or an inductor that is on a substrate, and wherein at least one of the first or second dies is on the substrate.

Example 19. A method of operating a voltage regulator (VR), the method comprising: sensing, by a first section of a sense circuitry included in a first die, a voltage or a current of a switch of the VR; digitalizing, by a second section of the sense circuitry included in a second die, the sensed voltage or current of the switch; and transmitting the digitalized sensed voltage or current of the switch to a controller that is included in one of the first or second dies.

Example 20. The method of example 19, further comprising: controlling, by the controller, the switching of the switch, wherein the switch is on the first die.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
a first die in a semiconductor package, the first die comprising a first section of a power converter; and
a second die in the semiconductor package, the second die comprising a second section of the power converter,
wherein the power converter comprises a plurality of switches, and power management (PM) circuitry to control operation of the power converter by controlling switching of the plurality of switches,
wherein the PM circuitry comprises a first part and a second part,
wherein the first section of the power converter in the first die comprises the first part of the PM circuitry, and
wherein the second section of the power converter in the second die comprises the second part of the PM circuitry, wherein the PM circuitry comprises a plurality of sense circuitries, wherein an individual sense circuitry of the plurality of sense circuitries is to sense one or both of a voltage or a current of a corresponding switch of the plurality of switches, wherein the first part of the PM circuitry in the first die comprises a first subset of the plurality of sense circuitries, and wherein the second part of the PM circuitry in the second die comprises a second subset of the plurality of sense circuitries.

2. The apparatus of claim 1, wherein the PM circuitry comprises:
a controller, wherein the first subset of the plurality of sense circuitries in the first die is to sense the voltage or current, and wherein the second subset of the plurality of sense circuitries in the second die is to transmit the voltage or current to the controller.

3. The apparatus of claim 2, wherein the second subset comprises an analog to digital converter (ADC) to digitalize the sensed voltage or current for transmission to the controller.

4. The apparatus of claim 1, wherein:
the first section of the power converter in the first die comprises a first subset of the plurality of switches; and
the second section of the power converter in the second die comprises a second subset of the plurality of switches.

5. The apparatus of claim 1, wherein the PM circuitry comprises:
a plurality of driver circuitries, wherein an individual driver circuitry of the plurality of driver circuitries is to drive a corresponding switch of the plurality of switches,
wherein the first section of the power converter in the first die comprises includes a first subset of the plurality of driver circuitries, and
wherein the second section of the power converter in the second die comprises includes a second subset of the plurality of driver circuitries.

6. The apparatus of claim 1, comprising:
a substrate, wherein at least one of the first or second dies is on the substrate,
wherein the power converter comprises a plurality of passive components, and
wherein one or more of the plurality of passive components are on, or embedded within, the substrate.

7. The apparatus of claim 1, wherein the power converter is a first power converter, and the semiconductor package further comprises a third die comprising a third section of a second power converter, wherein one of the first die or the second die comprises a fourth section of the second power converter.

8. The apparatus of claim 1, further comprising:
a power supply to supply power to the semiconductor package.

9. An apparatus, comprising:
a first die in a semiconductor package, the first die comprising a first section of a power converter; and
a second die in the semiconductor package, the second die comprising a second section of the power converter,
wherein the power converter comprises a plurality of switches, and power management (PM) circuitry to control operation of the power converter by controlling switching of the plurality of switches,
wherein the PM circuitry comprises a first part and a second part, a controller, and a feedback circuitry to measure an output voltage of the power converter, and transmit the measured voltage to the controller, the first section comprises the first part, and the second section comprises the second part,
wherein the first part of the PM circuitry in the first die comprises a first portion of the feedback circuitry, which is to measure the output voltage; and
wherein the second part of the PM circuitry in the second die comprises a second portion of the feedback circuitry, which is to digitalize the measurement of the output voltage and transmit the digitalized measurement of the output voltage to the controller.

10. The apparatus of claim 9, wherein the PM circuitry comprises:
a plurality of analog components; and
a plurality of digital components,
wherein the first part of the PM circuitry in the first die includes the plurality of analog components; and
wherein the second part of the PM circuitry in the second die includes the plurality of digital components.

11. The apparatus of claim 9, wherein:
the first section of the power converter in the first die comprises a first subset of the plurality of switches; and
the second section of the power converter in the second die comprises a second subset of the plurality of switches.

12. The apparatus of claim 9, wherein the PM circuitry comprises:
a plurality of driver circuitries, wherein an individual driver circuitry of the plurality of driver circuitries is to drive a corresponding switch of the plurality of switches,
wherein the first section of the power converter in the first die comprises a first subset of the plurality of driver circuitries, and
wherein the second section of the power converter in the second die comprises a second subset of the plurality of driver circuitries.

13. The apparatus of claim 9, comprising:
a substrate, wherein at least one of the first or second dies is on the substrate,
wherein the power converter comprises a plurality of passive components, and
wherein one or more of the plurality of passive components are on, or embedded within, the substrate.

14. The apparatus of claim 9, further comprising:

a power supply to supply power to the semiconductor package.

15. An apparatus, comprising:

a first die in a semiconductor package, the first die comprising a first section of a power converter;

a second die in the semiconductor package, the second die comprising a second section of the power converter; and a substrate, wherein one or more passive components of the power converter are on, or embedded within, the substrate, wherein the substrate has a first side and a second side that is opposite the first side, wherein the substrate has a recess on the first side, wherein the first die is at least in part within the recess on the first side of the substrate, wherein the second die is on the second side of the substrate or stacked on the first die, wherein the power converter comprises a plurality of switches, and power management (PM) circuitry to control operation of the power converter by controlling switching of the plurality of switches, and wherein the PM circuitry comprises a first part and a second part, wherein the first section of the power converter in the first die comprises the first part of the PM circuitry, and wherein the second section of the power converter in the second die comprises the second part of the PM circuitry.

16. The apparatus of claim 15, wherein:

the recess is a first recess; and the substrate has a second recess on the first side, wherein the first die is at least in part within the second recess on the first side of the substrate.

17. The apparatus of claim 15, wherein the power converter is a first power converter, and wherein the semiconductor package further comprises:

a third die comprising a first section of a second power converter, wherein one of the first die or the second die comprises a second section of the second power converter.

18. The apparatus of claim 15, wherein the first section comprises a first subset of the plurality of switches, and the second section comprises a second subset of the plurality of switches.

19. The apparatus of claim 15, wherein the PM circuitry comprises a plurality of driver circuitries, wherein an individual driver circuitry of the plurality of driver circuitries is to drive a corresponding switch of the plurality of switches, the first section comprises a first subset of the plurality of driver circuitries, and the second section comprises a second subset of the plurality of driver circuitries.

20. The apparatus of claim 15, further comprising:

a power supply to supply power to the semiconductor package.

\* \* \* \* \*